US008274789B2

(12) United States Patent
Nakamichi et al.

(10) Patent No.: US 8,274,789 B2
(45) Date of Patent: Sep. 25, 2012

(54) DISPLAY DEVICE

(75) Inventors: Masaya Nakamichi, Osaka (JP); Shohei Takahashi, Osaka (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 375 days.

(21) Appl. No.: 12/568,764

(22) Filed: Sep. 29, 2009

(65) Prior Publication Data

US 2010/0078152 A1   Apr. 1, 2010

(30) Foreign Application Priority Data

Sep. 30, 2008   (JP) ................................. 2008-255680

(51) Int. Cl.
*H05K 7/20* (2006.01)
(52) U.S. Cl. .............. 361/688; 361/679.46; 361/679.47; 361/679.48; 361/679.52; 361/696; 361/700; 165/104.14; 165/104.33; 165/121; 165/122; 165/185
(58) Field of Classification Search ............ 361/679.46–679.54, 688–697, 701, 721–727, 831; 165/104.14, 165/104.26, 104.33, 104.34, 121–126, 185; 313/46, 48, 582, 22–25, 35, 36, 44, 27, 11, 313/13, 17; 345/1.1, 84, 87, 214; 349/161, 349/60–65, 20; 362/31, 373, 97.1, 632, 240, 362/294
See application file for complete search history.

(56) References Cited

U.S. PATENT DOCUMENTS

| | | | | |
|---|---|---|---|---|
| 5,991,153 A * | 11/1999 | Heady et al. | ................... | 361/704 |
| 6,198,222 B1 * | 3/2001 | Chang | ........................... | 313/582 |
| 6,364,507 B1 * | 4/2002 | Yang | .............................. | 362/248 |
| 6,493,440 B2 * | 12/2002 | Gromatzky et al. | .......... | 379/161 |
| 6,917,143 B2 * | 7/2005 | Matsui et al. | .................... | 313/35 |
| 7,161,803 B1 * | 1/2007 | Heady | ........................... | 361/700 |
| 7,173,678 B2 * | 2/2007 | Havelka et al. | .................. | 349/58 |
| 7,319,589 B1 * | 1/2008 | Heady et al. | .................. | 361/700 |
| 7,324,174 B2 * | 1/2008 | Hafuka et al. | .................. | 349/61 |
| 7,570,489 B1 * | 8/2009 | Sun et al. | ....................... | 361/695 |
| 7,651,249 B2 * | 1/2010 | Ohashi et al. | ................. | 362/373 |
| 7,667,964 B2 * | 2/2010 | Kang et al. | ..................... | 361/692 |
| 7,762,707 B2 * | 7/2010 | Kim et al. | ..................... | 362/632 |
| 7,813,124 B2 * | 10/2010 | Karppanen | .............. | 361/679.56 |
| 7,912,590 B2 * | 3/2011 | Wilkes | .......................... | 700/291 |
| 7,995,342 B2 * | 8/2011 | Nakamichi et al. | ........... | 361/696 |

(Continued)

FOREIGN PATENT DOCUMENTS

EP   0422587 A2   4/1991

(Continued)

OTHER PUBLICATIONS

Search Report issued on Aug. 24, 2010 in the corresponding to the European Patent Application No. 09012214.4-1228/2169454.

*Primary Examiner* — Michail V Datskovskiy
(74) *Attorney, Agent, or Firm* — NDQ&M Watchstone LLP

(57) ABSTRACT

A display device according to the present invention comprises a housing having a waterproof structure and provided with an accommodation room formed therein, a ventilation part defined outside the accommodation room and leading to outside of the housing, a display panel arranged inside the accommodation room and including a display screen viewable from a front surface side of the housing, and one or a plurality of heat pipes arranged on a rear surface side of the display panel. The heat pipe passes through a side surface wall forming the accommodation room and extends from inside of the accommodation room to inside of the ventilation part.

6 Claims, 15 Drawing Sheets

U.S. PATENT DOCUMENTS

| | | | |
|---|---|---|---|
| 8,035,968 B2 * | 10/2011 | Kwon et al. | 361/695 |
| 2003/0066221 A1 * | 4/2003 | Cheng | 40/564 |
| 2006/0077636 A1 * | 4/2006 | Kim | 361/688 |
| 2006/0181670 A1 | 8/2006 | Kurokawa et al. | |
| 2008/0148609 A1 * | 6/2008 | Ogorevc | 40/463 |

FOREIGN PATENT DOCUMENTS

| | | | | |
|---|---|---|---|---|
| FR | 2893752 | A1 | | 5/2007 |
| GB | 2402205 | A | * | 6/2003 |
| JP | 403022595 | A | * | 1/1991 |
| JP | 03175481 | A | * | 7/1991 |
| JP | 403293693 | A | * | 12/1991 |
| JP | 403293694 | A | * | 12/1991 |
| JP | 2005196000 | A | * | 7/2005 |
| JP | 2005286987 | | | 10/2005 |
| JP | 2006011314 | A | * | 1/2006 |
| JP | 2008165101 | A | * | 7/2008 |
| WO | 2007116116 | A1 | | 10/2007 |

* cited by examiner

DISPLAY DEVICE

The application Number 2008-255680, upon which this patent application is based, is hereby incorporated by reference.

BACKGROUND OF THE INVENTION

1. Field of the Invention

The present invention relates to display devices, and particularly to a display device for outside installation.

2. Description of Related Art

Conventionally, as a monitor for image display, often used are flat-panel displays such as a liquid crystal display. Most of the conventional liquid crystal displays are designed assuming that they are installed indoors, and the measures to protect the liquid crystal display against weather, dust or the like are not taken. Thus, it has been difficult to permanently install the conventional liquid crystal display outdoors.

However, in recent years it is desired that a liquid crystal display is permanently installed outdoors. The reason includes the fact that the liquid crystal display has a small thickness and that the resolution of the image is high. The small thickness allows the installation of the display on the outer wall of the building or in narrow places such as a bus stop. In addition, the high resolution allows an image to be displayed clearly even if the display screen is small.

Therefore, thought is an attempt to arrange a liquid crystal display, particularly an image display panel which is easy to be damaged by weather and dust among liquid crystal displays, in the inside of an accommodation room that has a waterproof structure in order to protect the liquid crystal display from weather and dust.

However, since there is no escape of heat from the inside of the accommodation room to the outside when the image display panel is arranged in the inside of the accommodation room and it is waterproofed, the image display panel cannot be air-cooled naturally. Thus, a blackout occurs. The blackout is a phenomenon in which the temperature of the image display panel rises due to the heat generated from an image display panel in operation or the sun light, and an original function of the liquid crystal falls to disable the image display.

SUMMARY OF THE INVENTION

A first display device according to the present invention comprises a housing having a waterproof structure and provided with an accommodation room formed therein, a ventilation part defined outside the accommodation room and leading to outside of the housing, a display panel arranged inside the accommodation room and including a display screen viewable from a front surface side of the housing, and one or a plurality of heat pipes arranged on a rear surface side of the display panel. The heat pipe passes through a side surface wall forming the accommodation room and extends from inside of the accommodation room to inside of the ventilation part.

A second display device according to the present invention is the first display device, wherein a heat releasing member is connected to the heat pipe in the ventilation part.

A third display device according to the present invention is the second display device, wherein the heat releasing member comprises a first heat releasing part and a second heat releasing part which sandwich the heat pipe from both sides, a pair of grooves is defined in the first heat releasing part and the second heat releasing part, and the heat pipe fits in the pair of grooves.

A fourth display device according to the present invention is the third display device, wherein the plurality of heat pipes are arranged in line in the vertical direction on the rear surface side of the display panel, the heat releasing member which comprises the first heat releasing part and the second heat releasing part is connected to each of the plurality of heat pipes, the first heat releasing parts are arranged on the front surface of the housing side of the heat pipes and formed integrally, and the second heat releasing parts are arranged on the rear surface of the housing side of the heat pipes and formed integrally.

A fifth display device according to the present invention is the second display device, wherein a groove in which the heat pipe is to fit in the ventilation part is defined in the heat releasing member.

A sixth display device according to the present invention is any one of the first to fifth display devices, wherein the display device further comprises a fan making air flow along the ventilation part, which is arranged in the ventilation part.

A seventh display device according to the present invention is the sixth display device, wherein the ventilation part extends in the vertical direction, and the fan makes air in the ventilation part flow from bottom to top.

An eighth display device according to the present invention is any one of the first to seventh display devices, wherein the heat pipe is fixed to the rear surface of the display panel.

A ninth display device according to the present invention comprises a display panel, a housing sealing around the display panel and making a display screen of the display panel viewable from outside, a ventilation part defined on a side surface side of the display panel and extending in the vertical direction, a heat pipe arranged on a rear surface side of the display panel and extending into the ventilation part, and a fan making air in the ventilation part flow from one end to the other end of the ventilation part.

DETAILED DESCRIPTION OF THE PREFERRED EMBODIMENT

An image display system in which a display device of a preferred embodiment of the present invention is installed is discussed in detail below with reference to drawings.

1. General Description of Image Display System

Figure 1:
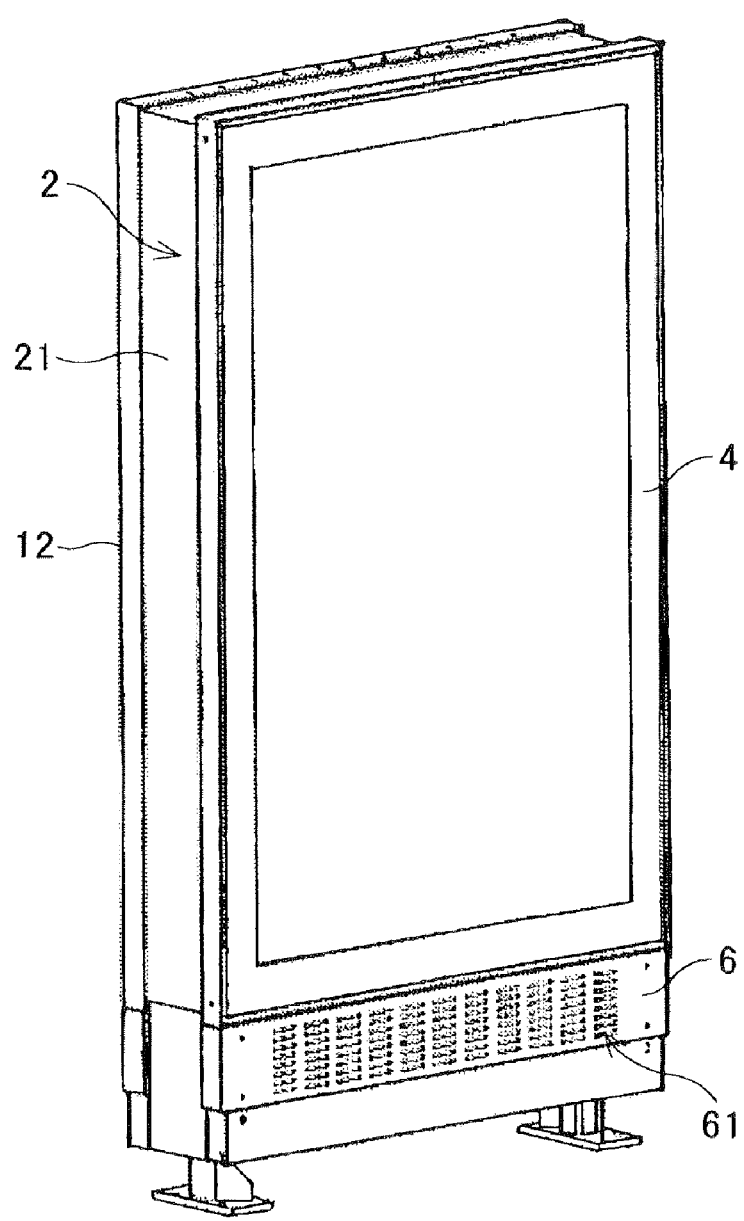
FIG. 1 is a perspective view of an image display system in which a display device is installed.
Figure 2:
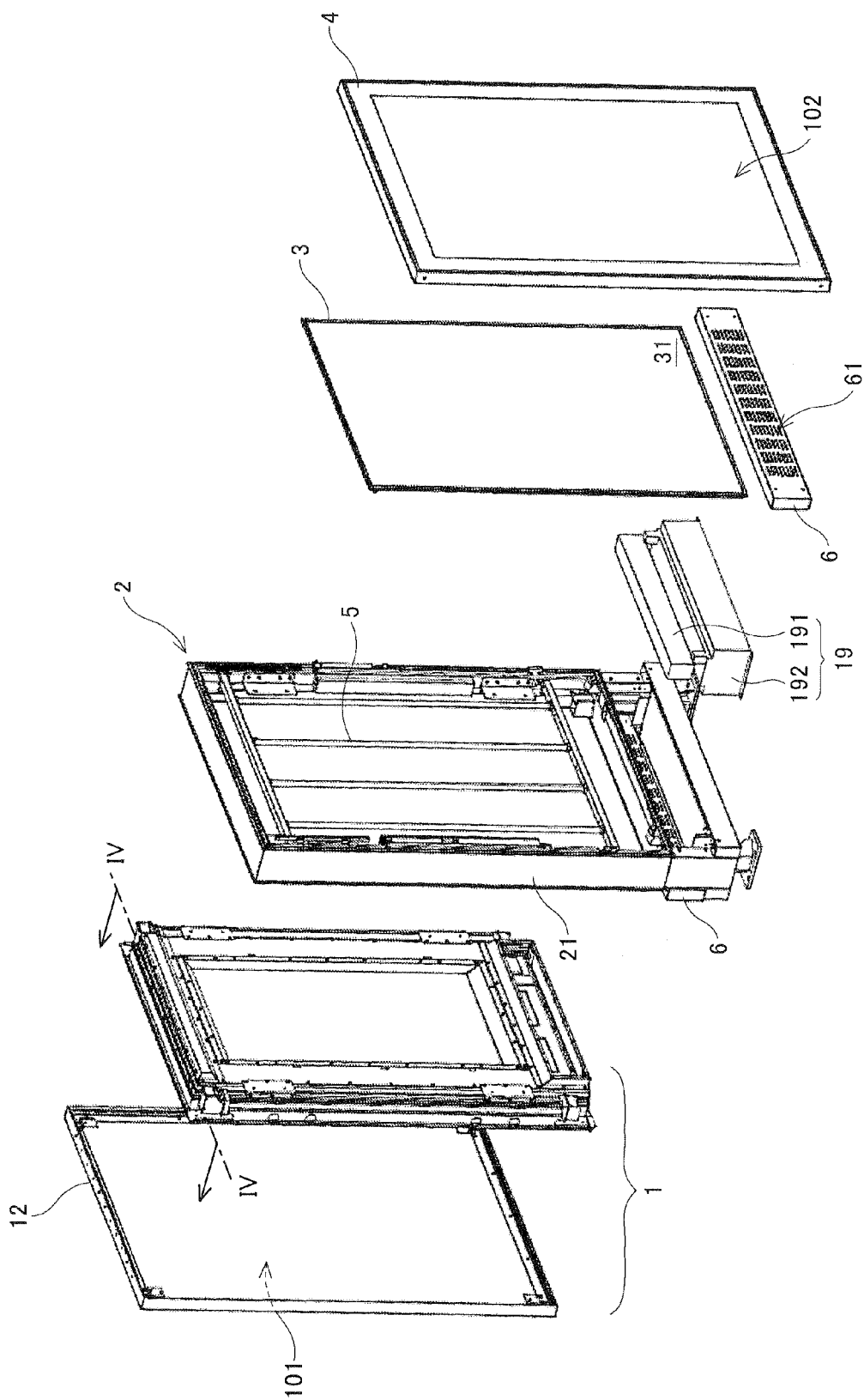
FIG. 2 is an exploded perspective view of the image display system.

An image display system has a flat rectangular solid-shaped appearance as shown in FIG. 1, and comprises an image display device 1, a base 2, a backboard 3, a cover 4, a lighting apparatus 5 and a ventilation plate 6 as shown in FIG. 2.

Figure 5:
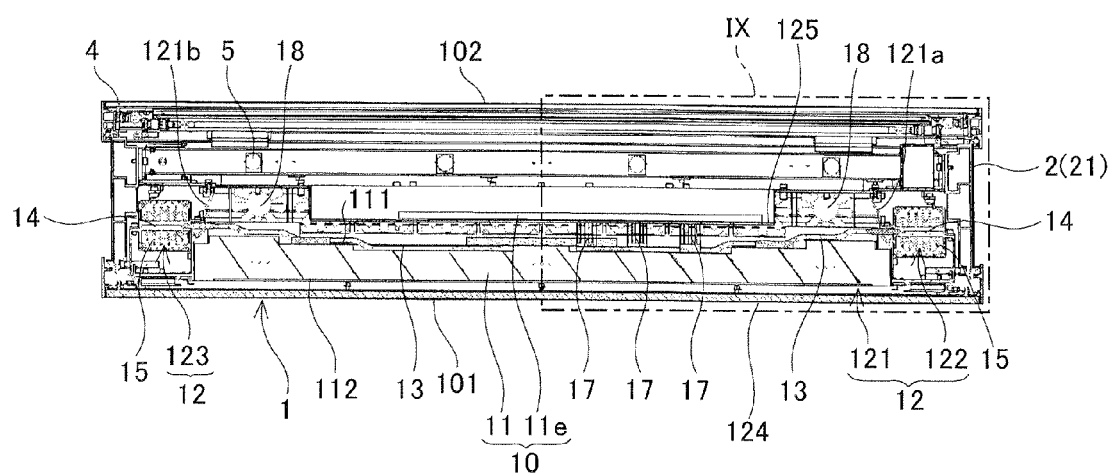
FIG. 5 is a cross-sectional view taken along a line V-V shown in FIG. 4.

The image display device 1 is a device displaying a video on a front surface 101 of the image display system, and includes a liquid crystal display 10 as shown in FIG. 5. More details of the image display device 1 are described in "2. IMAGE DISPLAY DEVICE".

On the base 2, formed is a frame member 21 for attaching the image display device 1 and the backboard 3, and the frame member 21 has a structure in which the image display device 1 and the backboard 3 can be fitted therein.

The backboard 3 is an installation base for affixing an advertising material, and is placed in the frame member 21 on a rear surface side of the image display device 1. The advertising material is affixed to a front surface 31 of the backboard 3, namely a surface facing a rear surface 102 side of the image display system.

Here, the backboard 3 is formed of a light transmitting material in order to transmit light emitted from the lighting apparatus 5. Also, the advertising material affixed to the backboard 3 is formed of a light transmitting material in order to transmit the light emitted from the lighting apparatus 5. The advertising material formed of the light transmitting material is hereinafter referred to as an advertising film.

The cover 4 is attached to the base 2, and covers the front surface 31 of the backboard 3 to which the advertising material is affixed. The advertising material is thereby protected by the cover 4.

Also, a part of the cover 4 opposed to the front surface 31 of the backboard 3 is formed of a light transmitting material. It is thus possible to view the advertising material from the rear surface 102 side of the image display system.

The lighting apparatus 5 is an apparatus for illuminating the advertising film affixed to the front surface 31 of the backboard 3, and comprises a plurality of fluorescent lamps extending in a generally vertical direction. The lighting apparatus 5 is attached to the frame member 21 of the base 2 at a position between the image display device 1 and the backboard 3. Details of arrangement of the lighting apparatus 5 are described in "3. ARRANGEMENT OF LIGHTING APPARATUS".

By illuminating the advertising film by the lighting apparatus 5, it is possible to view letters or the like printed on the advertising film even at night.

The ventilation plate 6 is arranged on each of the front surface 101 and the rear surface 102 of the image display system at a position below the image display device 1. In the ventilation plate 6, defined are a plurality of ventilation holes 61 via which the inside and the outside of the image display system communicate with each other.

Figure 3:
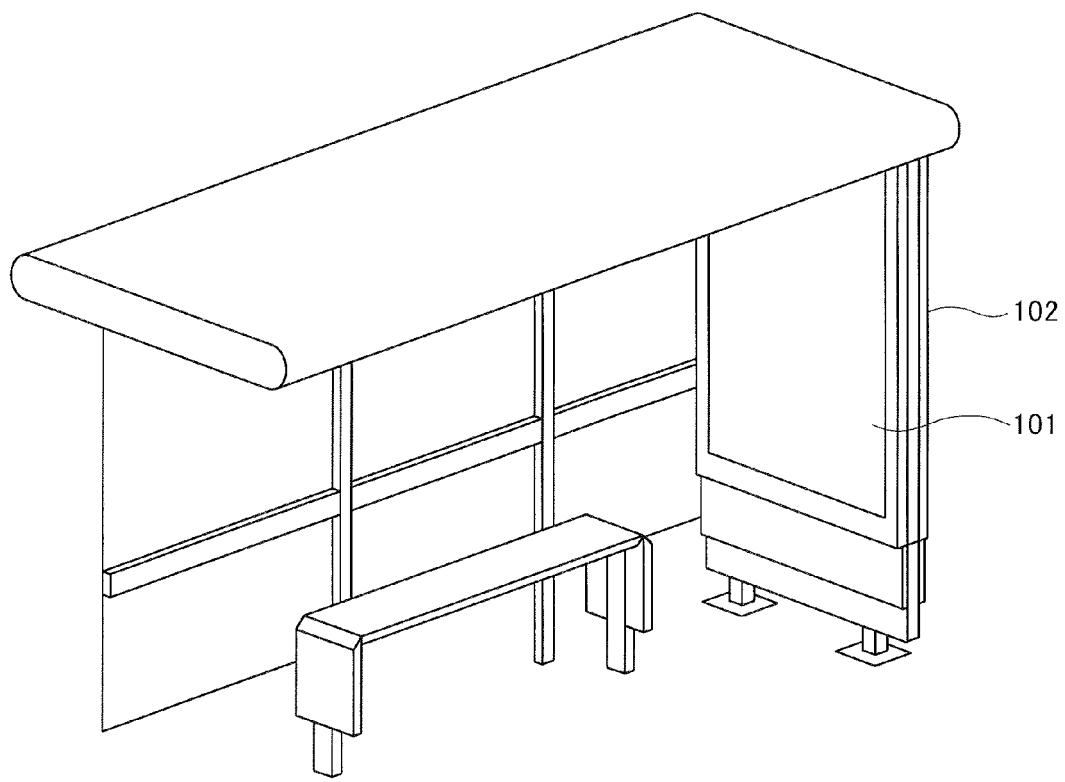
FIG. 3 is a perspective view showing a usage example of the image display system.

The image display system described above is placed at a bus stop, for example, as shown in FIG. 3. In such a case, the image display system is placed so that the front surface 101 faces the inside of the bus stop and the rear surface 102 faces the outside of the bus stop.

It is thereby possible to provide various information to a user waiting in a bus stop with a still image or a moving image, and provide various information to a person passing outside the bus stop. It is also possible to easily update the information displayed on the front surface 101 by the image display device 1 by remote-controlling the image display system in a wired or wireless manner. Further, it is possible to collectively manage the image display systems placed in a plurality of bus stops.

Since the front surface 101 of the image display system faces the inside of the bus stop according to the installed condition of the image display system described above, it is hard for a driver of a car or the like passing near the bus stop to see the front surface 101. Therefore, even when a moving image is displayed on the front surface 101, the attention of the driver is hard to be attracted to the moving image.

2. Image Display Device

Figure 4:
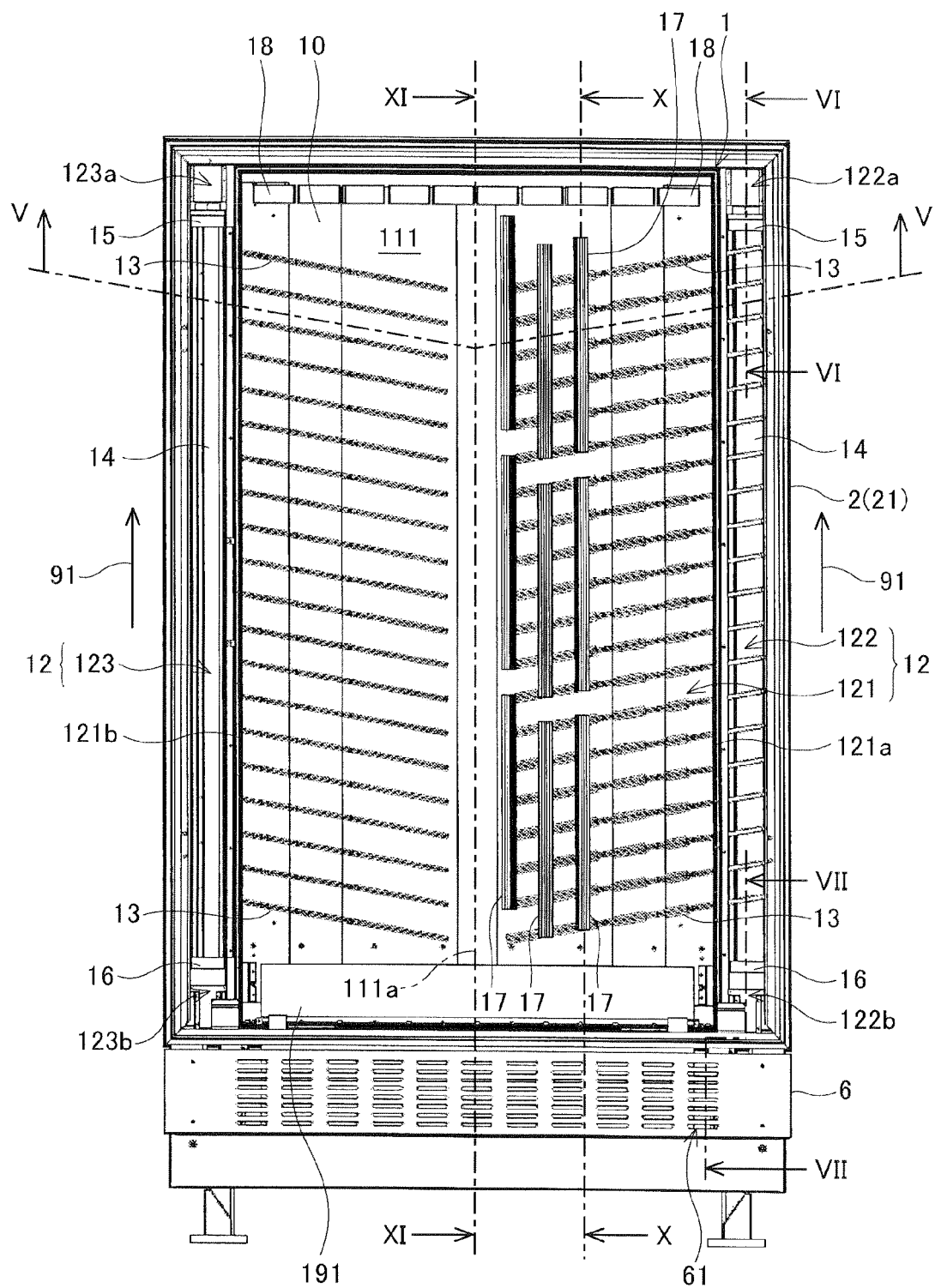
FIG. 4 is a cross-sectional view taken along a line IV-IV shown in FIG. 2.
Figure 11:
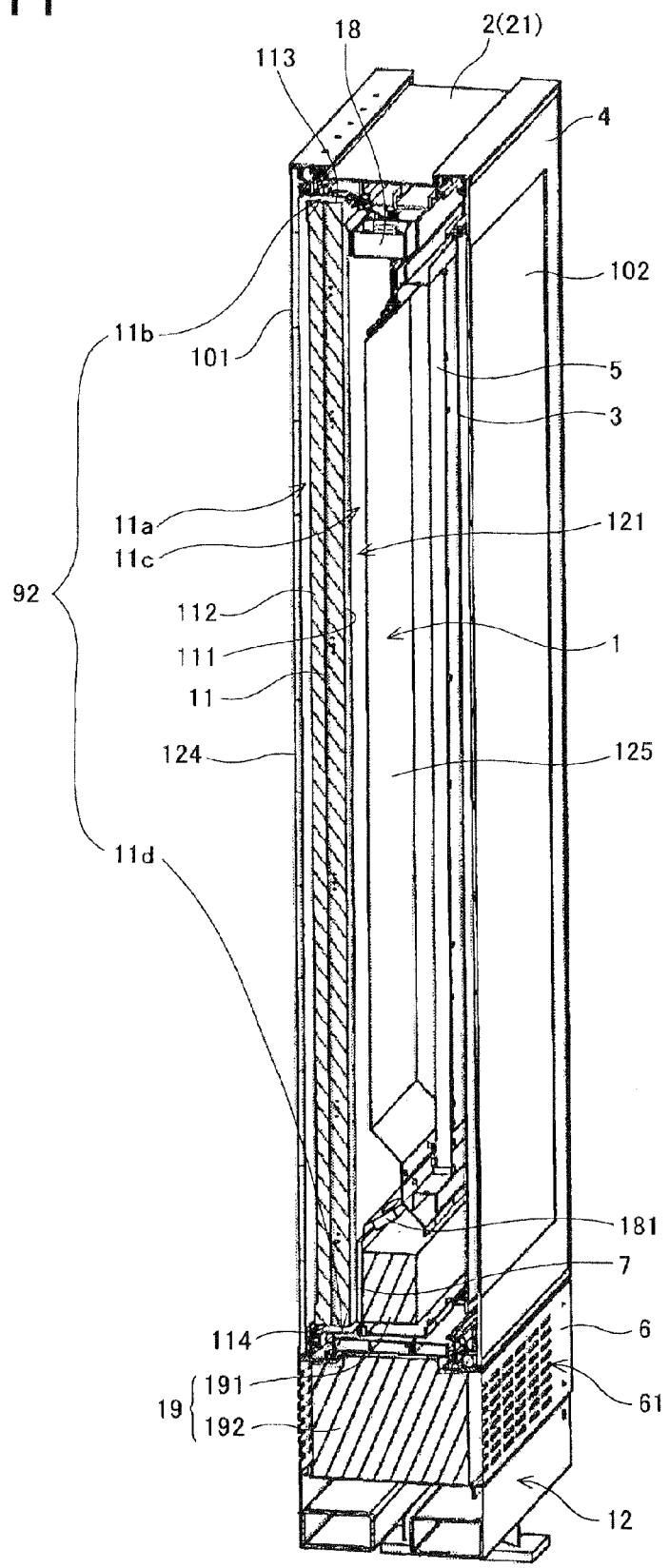
FIG. 11 is a perspective view taken along a line XI-XI shown in FIG. 4 without showing a part.

The image display device 1 includes the liquid crystal display 10, a housing 12, a plurality of heat pipes 13, circulation fans 18, heat releasing fins 14, ventilation fans 15, 16 and a heat collecting fins 17 as shown in FIGS. 4 and 5. As shown in FIG. 11, the image display device 1 further includes an air conditioning machine 19, circulation fans 181 and a heat insulation member 7.

2-1. Liquid Crystal Display

The liquid crystal display 10 is a flat-panel display, and includes an image display panel 11 and a circuit board 11e for controlling the image display panel 11 as shown in FIG. 5. The image display panel 11 is arranged inside an accommodation room 121 to be discussed later, while the circuit board 11e is arranged on an outer surface of a rear surface wall 125 forming the accommodation room 121.

The image display panel 11 may take various shapes depending on the intended use. In this embodiment, the image display panel 11 takes a lengthwise rectangular shape so that the image display system can be installed in a narrow place such as a bus stop. Also, a part of the image display panel 11 adjacent to a display screen 112 in particular is easy to generate heat and be heated to a high temperature.

2-2. Housing (Accommodation Room)

Figure 12:
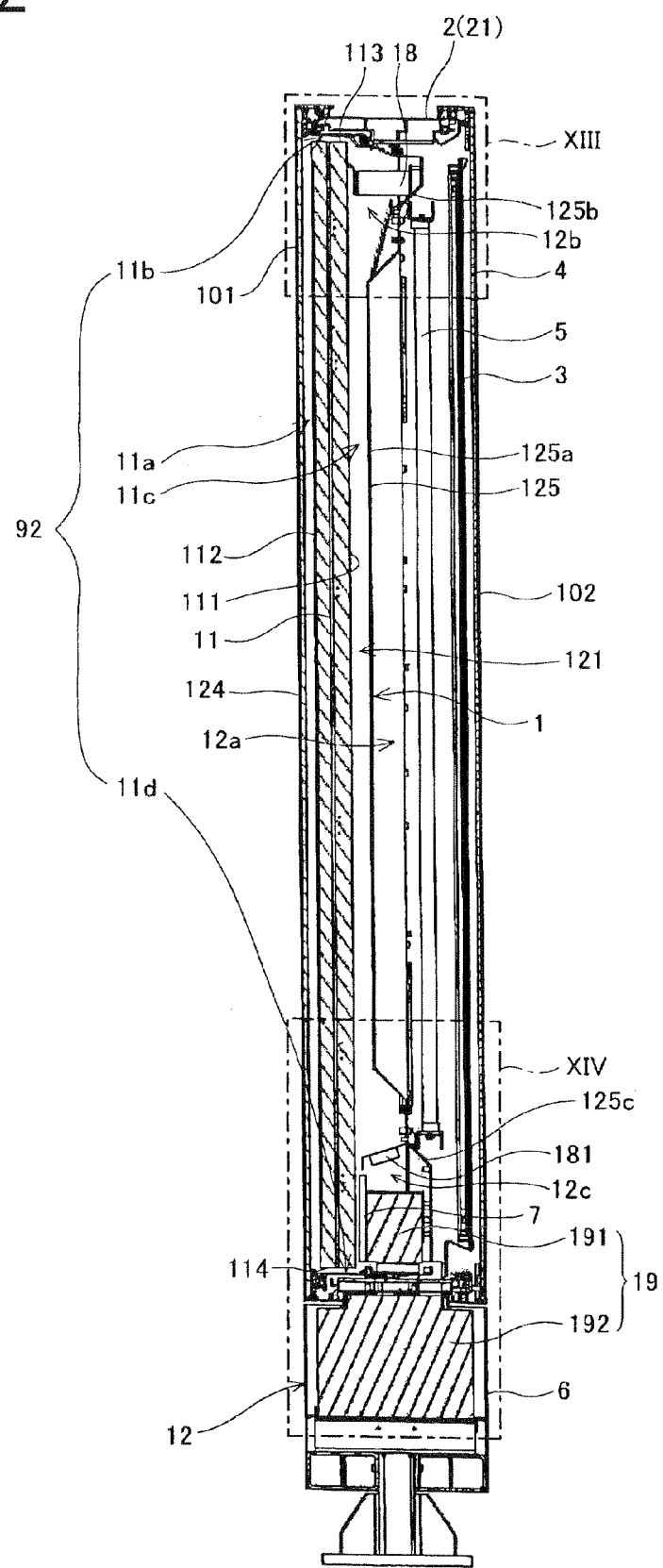
FIG. 12 is a cross-sectional view taken along a line XI-XI shown in FIG. 4.

The housing 12 has a waterproof structure, and is provided with the accommodation room 121 formed therein as shown in FIG. 4. The image display panel 11 is arranged inside the accommodation room 121 with the display screen 112 facing the front surface 101 of the image display system as shown in FIG. 12.

In particular, the housing 12 includes a front surface wall 124 located on the display screen 112 side of the image display panel 11, a rear surface wall 125 located on a rear surface 111 side of the image display panel 11, and side surface walls 121a, 121b located on the opposite sides of the image display panel 11. Also, the frame member 21 of the base 2 has an upper end part located on an upper end surface 113 side of the image display panel 11 and a lower end part located on a lower end surface 114 side of the image display panel 11.

The accommodation room 121 is formed by the front surface wall 124, the rear surface wall 125, the side surface walls 121a, 121b, and the upper end part and the lower end part of the frame member 21, and is maintained in a sealed or substantially sealed state.

Thus, by arranging the image display panel 11 inside the accommodation room 121 maintained in the sealed or substantially sealed state, it is possible to protect the image display panel 11 from weather and dust even when the image display device 1 is installed outdoors.

The rear surface wall 125 is arranged at a position between the image display panel 11 and the backboard 3.

A part of the front surface wall 124 opposed to the display screen 112 of the image display panel 11 is formed by a light transmitting material, a glass material in particular, and the front surface wall 124 forms not only the accommodation room 121 but also the front surface 101 of the image display system. It is thus possible to view the display screen 112 of the image display panel 11 from the front surface side of the housing 12, i.e. the front surface 101 side of the image display system.

(Circulation Flow Path)

Inside the accommodation room 121, formed is a circulation flow path 92 surrounding the image display panel 11 as shown in FIGS. 11 and 12. Illustration of the heat pipe 13 and the heat collecting fins 17 are omitted in order to show the circulation flow path 92 clearly in FIGS. 11 and 12 and also in FIGS. 13 and 14 to be discussed later.

In this embodiment, the circulation flow path 92 comprises four flow path portions 11a to 11d. The flow path portion 11a is defined between the front surface wall 124 forming the accommodation room 121 and the display screen 112 of the image display panel 11, and extends along the display screen 112 in the generally vertical direction. The flow path portion 11b is defined between the upper end part of the frame member 21 forming the frame 2 and the upper end surface 113 of the image display panel 11. The flow path portion 11c is defined between the rear surface wall 125 forming the accommodation room 121 and the rear surface 111 of the image display panel 11, and extends along the rear surface 111 in the generally vertical direction. The flow path portion 11d is defined between the lower end part of the frame member 21 and the lower end surface 114 of the image display panel 11.

The flow path portions 11a to 11d are connected to each other in this order circumferentially around the image display panel 11 to surround the image display panel 11. In other words, the upper end parts of the flow path portion 11a and the flow path portion 11c communicate with each other via the flow path portion 11b, and the lower end parts of the flow path portion 11a and the flow path portion 11c communicate with each other via the flow path portion 11d.

The air in the circulation flow path 92 is circulated around the image display panel 11 by the circulation fans 18, 181 as to be discussed later. Therefore, the heat generated in a part adjacent to the display screen 112 of the image display panel 11 moves to the rear surface 111 side of the image display panel 11 through the medium of the air in the circulation flow path 92.

(Ventilation Path)

Inside the housing 12, defined is ventilation paths 122, 123 leading to the outside of the housing 12 at positions outside the accommodation room 121. In particular, as shown in FIG. 4, the ventilation path 122 extends in the generally vertical direction along one of the side surface walls 121a forming the accommodation room 121, and the ventilation path 123 extends along the other side surface wall 121b forming the accommodation room 121.

Thus, by defining the ventilation paths 122, 123 on both sides of the accommodation room 121, it is possible to avoid an increase in size in the thickness direction of the image display device 1.

Figure 6:
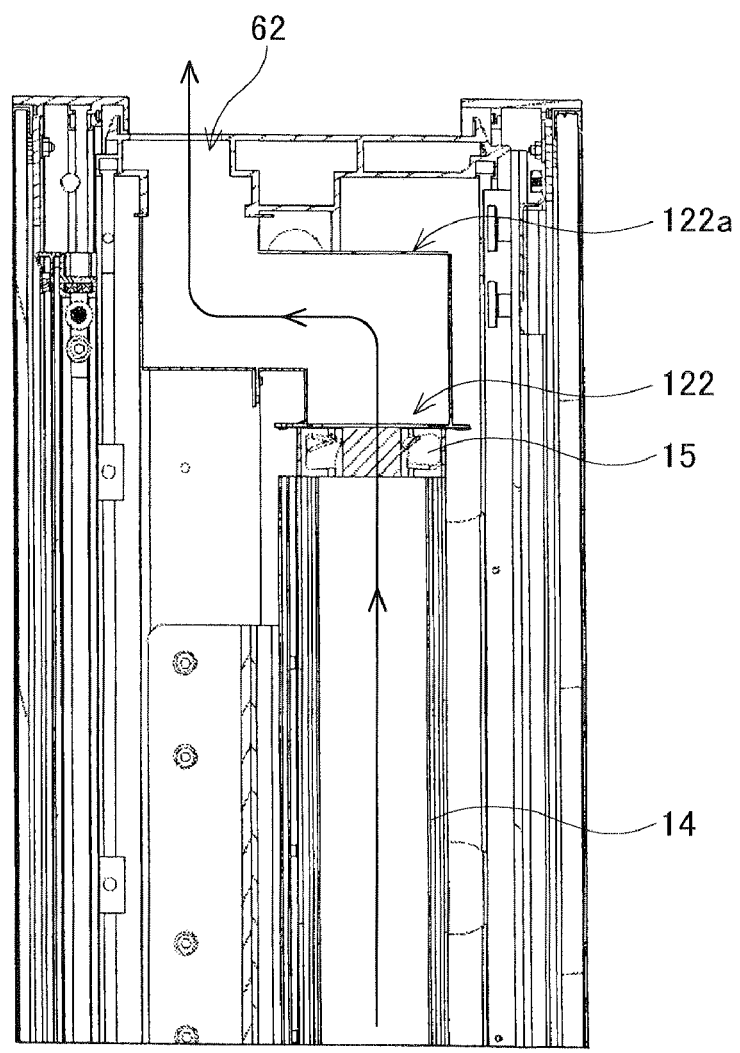
FIG. 6 is a cross-sectional view taken along a line VI-VI shown in FIG. 4.
Figure 8:
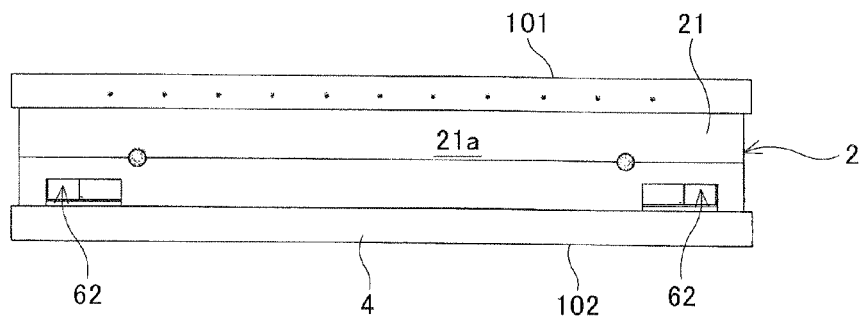
FIG. 8 is a plain view of the image display system.

An upper end part 122a of the ventilation path 122 bends in a crank shape as shown in FIG. 6, and leads to the outside of the housing 12 through a ventilation hole 62 (cf. FIG. 8) provided on an upper surface 21a of the frame member 21 of the base 2. It is similar about an upper end part 123a of the ventilation path 123.

Figure 7:
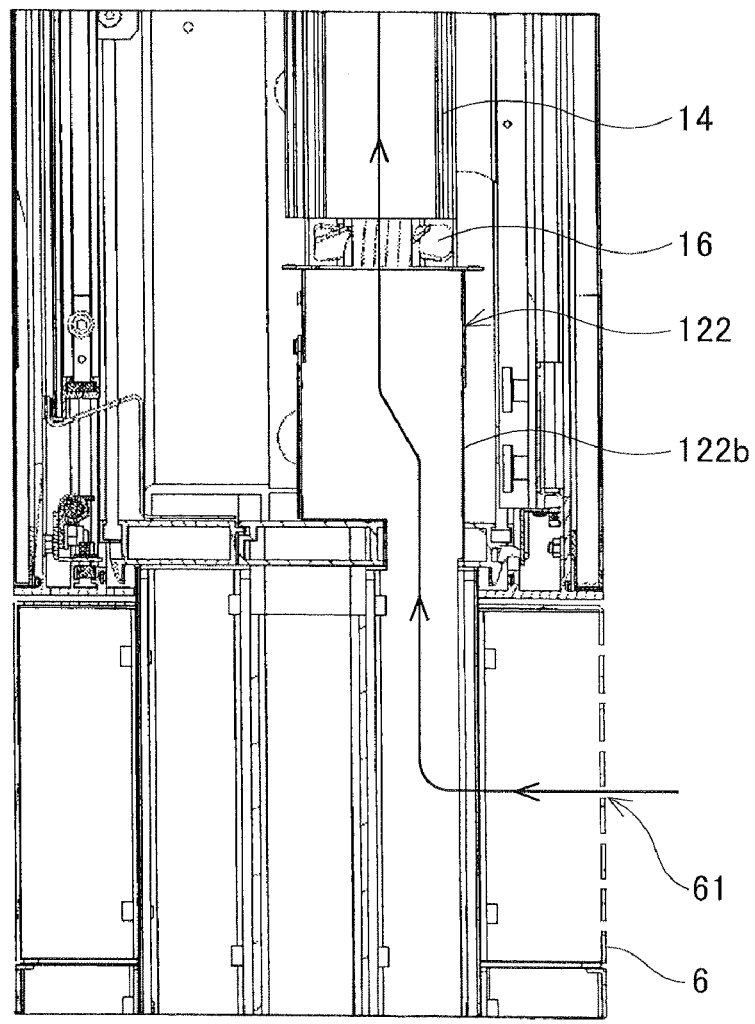
FIG. 7 is a cross-sectional view taken along a line VII-VII shown in FIG. 4.

As shown in FIG. 7, a lower end part 122b of the ventilation path 122 leads to the outside of the housing 12 through the ventilation hole 61 of the ventilation plate 6 placed below the image display device 1.

2-3. Heat Pipe

A plurality of heat pipes 13 are arranged in the flow path portion 11c of the circulation flow path 92. In particular, the plurality of heat pipes 13 is fixed to the rear surface 111 of the image display panel 11 being repeatedly arranged at a predetermined interval in the generally vertical direction as shown in FIG. 4. In this embodiment, one set of the heat pipes 13 arranged in such a manner is provided on either side of a centerline 111a of the rear surface 111.

Figure 9:
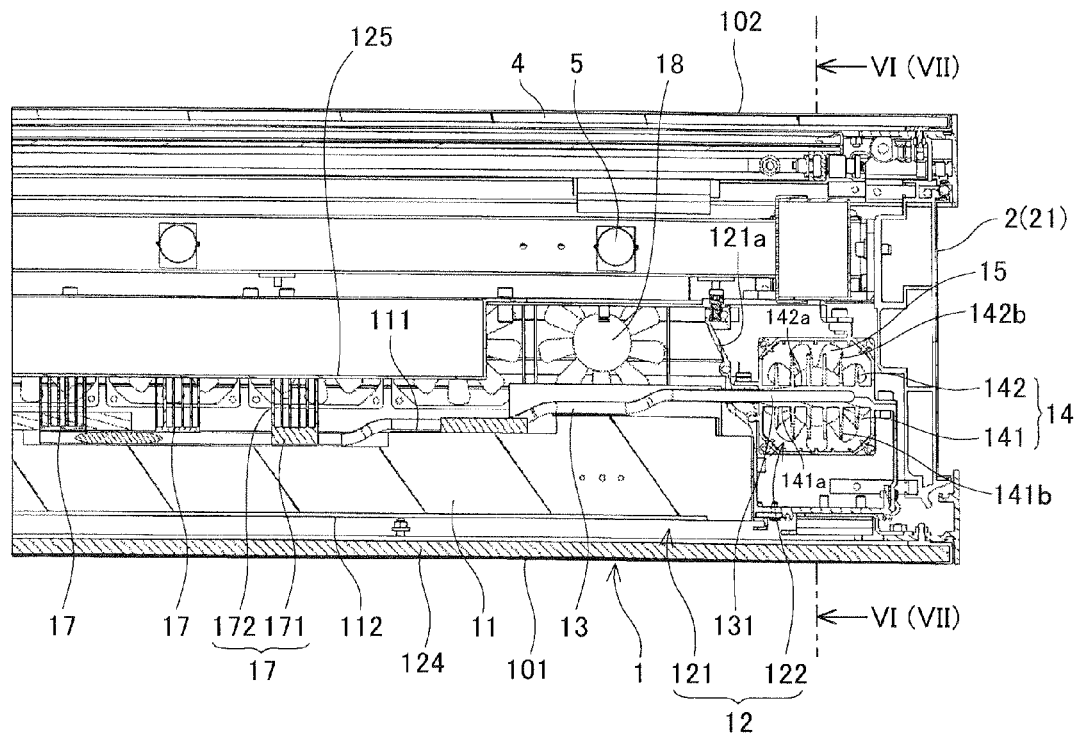
FIG. 9 is an enlarged view of a IX area shown in FIG. 5.

As shown in FIG. 9, the heat pipe 13 arranged on the ventilation path 122 side of the centerline 111a passes through one of the side surface walls 121a forming the accommodation room 121 to extend from the inside of the accommodation room 121 to the inside of the ventilation path 122. In particular, the heat pipe 13 extends from the rear surface 111 of the image display panel 11 towards the ventilation path 122, and passes through the one of the side surface walls 121a to project into the inside of the ventilation path 122.

Here, on the side surface wall 121a forming the accommodation room 121, defined is a through-hole through which each of the heat pipes 13 passes. The through-hole is sealed by silicon rubber or the like with the heat pipe 13 passing therethrough. The inside of the accommodation room 121 is thereby maintained in the sealed state.

The heat pipe 13 arranged on the ventilation path 123 side of the centerline 111a passes through the other side surface wall 121b forming the accommodation room 121 to extend from the inside of the accommodation room 121 into the inside of the ventilation path 123 in a similar manner to the heat pipe 13 extending into the ventilation path 122 (cf. FIG. 5).

By using the heat pipes 13 described above, the heat generated from the image display panel 11 can be collected in the inside of the accommodation room 121. In other words, the heat can be collected from the air flowing through the circulation flow path 92 by the heat pipes 13, and the heat of the image display panel 11 can be collected directly from the rear surface 111 by the heat pipes 13. The collected heat is led to the outside of the accommodation room 121 by the heat pipes 13 to be released to the inside of the ventilation paths 122, 123. In other words, each heat pipes 13 functions as heat exchange means included in the image display device 1.

The heat released from the heat pipes 13 to the inside of the ventilation paths 122, 123 is released to the outside of the housing 12 through the ventilation paths 122, 123. Therefore, the temperature increase of the image display panel 11 is restrained. As a result, the function of the liquid crystal display 10 is maintained in a preferable state.

Since, in this embodiment, the heat pipes 13 are arranged in repetition on the rear surface 111 of the image display panel 11 at the predetermined interval, it is possible to collect the heat from the whole flow path portion 11c of the circulation flow path 92 and from the whole rear surface 111 of the image display panel 11. Cooling efficiency of the image display device 1 thereby becomes higher.

Since a refrigerant (water or the like) for heat exchange is filled in the inside of each heat pipe 13, it is preferable to arrange each of the heat pipes 13 diagonally as shown in FIG. 4 from a point of view of increasing the heat exchange efficiency of the heat pipe 13. The diagonally arranged heat pipes 13 extend from the inside of the accommodation room 121 to the inside of the ventilation paths 122, 123 obliquely upward.

A part (a low temperature part) of each heat pipe 13 located inside the ventilation paths 122, 123 is thereby at a higher place than a part (a high temperature part) located inside the accommodation room 121 in the generally vertical direction. Therefore, the refrigerant in the heat pipe 13 is evaporated in the high temperature part, to rise toward the low temperature part, and then, liquefied in the low temperature part to flow down towards the high temperature part, and it is evaporated in the high temperature part again.

Thus, by arranging the heat pipe 13 diagonally, the refrigerant circulates through the heat pipe 13 efficiently, and the heat exchange efficiency of the heat pipe 13 increases.

Further, in this embodiment, since the heat pipes 13 are arranged on the rear surface 111 of the image display panel 11, it is possible to avoid limit on the display screen 112 due to the arrangement of the heat pipe 13, e.g., a reduction in size of the display screen 112 or the increase in size of the image display device 1.

For further description of arrangement of the heat pipes 13, each of the heat pipes 13 described above is arranged along the rear surface 111 of the image display panel 11 from a point of view of increasing collecting efficiency of the heat from the rear surface 111 of the image display panel 11.

Figure 10:
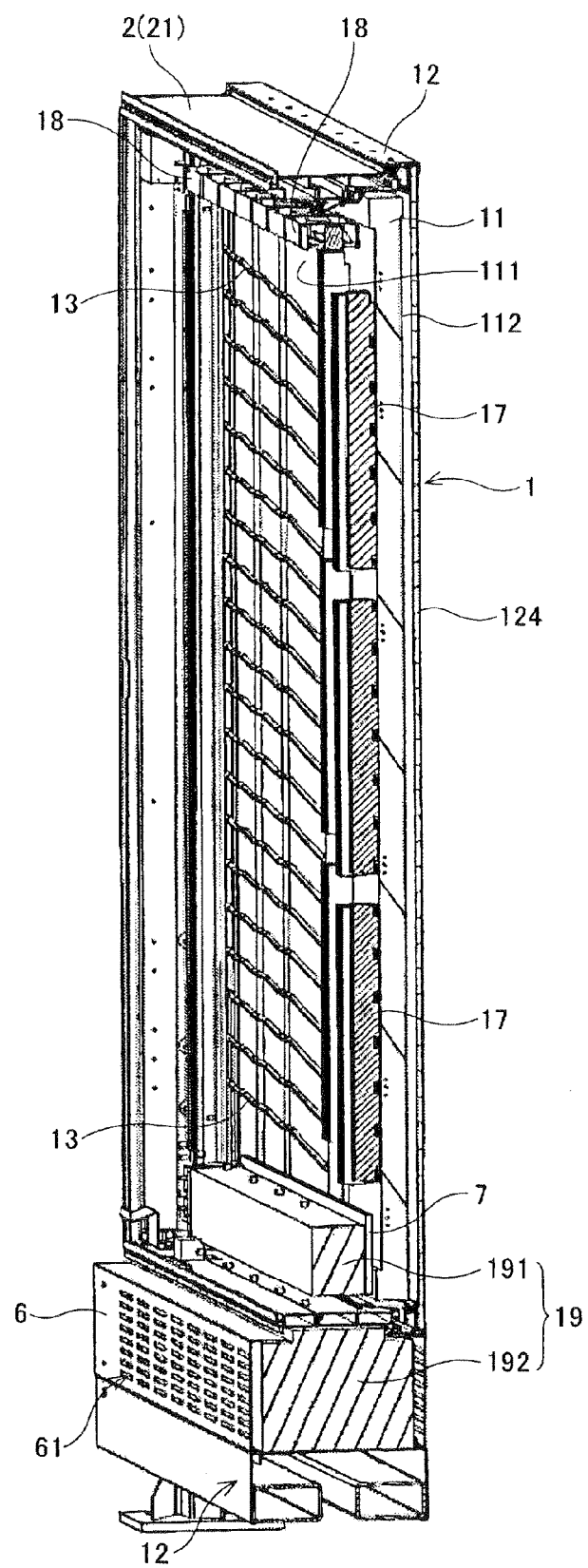
FIG. 10 is a perspective view taken along a line X-X shown in FIG. 4 without showing a part.

In this embodiment, a step is formed on the rear surface 111 of the image display panel 11 as shown in FIGS. 5 and 10 due to a relation between a mounting location of the image display panel 11 and mounting locations of electronic parts and the circuit board 11e mounted on the image display device 1. Each of the heat pipes 13 is bent in a crank shape in the step part so that the heat pipe 13 follows the shape of the rear surface 111 of the image display panel 11.

It is thereby possible to reduce wasted space produced due to deployment of the heat pipe 13. Also, contact area with the rear surface 111 of the image display panel 11 increases. As a result, the heat exchange efficiency between the heat pipe 13 and the image display panel 11 increases.

Further, in this embodiment, each of the heat pipes 13 is arranged in repetition at the predetermined interval in the generally vertical direction as shown in FIG. 4, and extends to the inside of the ventilation paths 122, 123 while keeping a distance with the adjacent heat pipe 13 at a predetermined interval. Thus, the heat pipes 13 are arranged in repetition at a predetermined interval in the generally vertical direction also in the inside of the ventilation paths 122, 123.

Therefore, the heat collected by the heat pipes 13 can be released dispersedly in the inside of the ventilation paths 122, 123. As a result, the heat exchange (heat dissipation) efficiency of the heat pipes 13 in the inside of the ventilation paths 122, 123 increases.

2-4. Air Conditioning Machine

The air conditioning machine 19 comprises an evaporator 191 and a condenser 192 which are heat exchangers as shown in FIG. 2 and FIGS. 10 to 12. Heat is collected by the evaporator 191, and the collected heat can be released by the condenser 192.

The evaporator 191 is arranged in the inside of the accommodation room 121 at a position on the rear surface 111 side of the image display panel 11 and adjacent to the lower end surface 114 of the image display panel 11 as shown in FIGS. 11 and 12. In other words, the evaporator 191 is arranged in the lower end part of the flow path portion 11c of the circulation flow path 92. Thus, it is possible to avoid the increase in size of the image display device 1 in the height direction by arranging the evaporator 191 on the rear surface 111 side of the image display panel 11.

Also, the circulation flow path 92 can be shortened by arranging the evaporator 191 on the rear surface 111 side, rather than the lower end surface 114 side, of the image display panel 11.

As shown in FIGS. 11 and 12, the condenser 192 is arranged at a position inside the housing 12 and outside the accommodation room 121. In particular, the condenser 192 is arranged at a position below the accommodation room 121, i.e., a position below the image display panel 11. The condenser 192 is arranged opposed to the ventilation plate 6.

Since the heat exchange efficiency is high in both the evaporator 191 and the condenser 192 in the air conditioning machine 19 described above, heat can be efficiently collected from the air flowing in the circulation flow path 92 by the evaporator 191, and efficiently released by the condenser 192 to the outside of the housing 12 via the plurality of ventilation holes 61 provided to the ventilation plate 6. Therefore, the heat generated from the image display panel 11 is collected by the air conditioning machine 19, and the temperature increase of the image display panel 11 is inhibited. As a result, the function of the image display panel 11 is maintained in a preferable state.

Thus, the air conditioning machine 19 functions as the heat exchanger included in the image display device 1.

In this embodiment, the air conditioning machine 19 is used as the heat exchanger collecting heat from the air in the circulation flow path 92, but another heat exchanger may be adopted instead of the air conditioning machine 19.

Also, the air conditioning machine 19 may comprise a compressor along with the evaporator 191 and the condenser 192. Preferably, the compressor is arranged at a position below the display panel 11, in particular, a position below the accommodation room 121.

In such a structure of the air conditioning machine 19, the air which circulates through the circulation flow path 92 and flowed into the air conditioning machine 19 is cooled by the evaporator 191, while the refrigerant in the evaporator 191 is evaporated by the heat from the air. The evaporated refrigerant is compressed by the compressor to be in a condition of the elevated temperature and pressure, and then flows into the condenser 192. In the condenser 192, the refrigerant of the elevated temperature and pressure is cooled to generate a liquid refrigerant at low temperature. And then, the liquid refrigerant flows into the evaporator 191 again to cool the air in the circulation flow path 92.

2-5. Circulation Fan

The circulation fans 18, 181 are fans for circulating the air in the circulation flow path 92 along the circulation flow path 92. As shown in FIGS. 11 and 12, the circulation fans 18 are arranged at a position on the rear surface 111 side of the image display panel 11 and adjacent to the upper end surface 113 of the image display panel 11. In other words, the circulation fans 18 are arranged in the upper end part of the flow path portion 11c of the circulation flow path 92.

Figure 13:
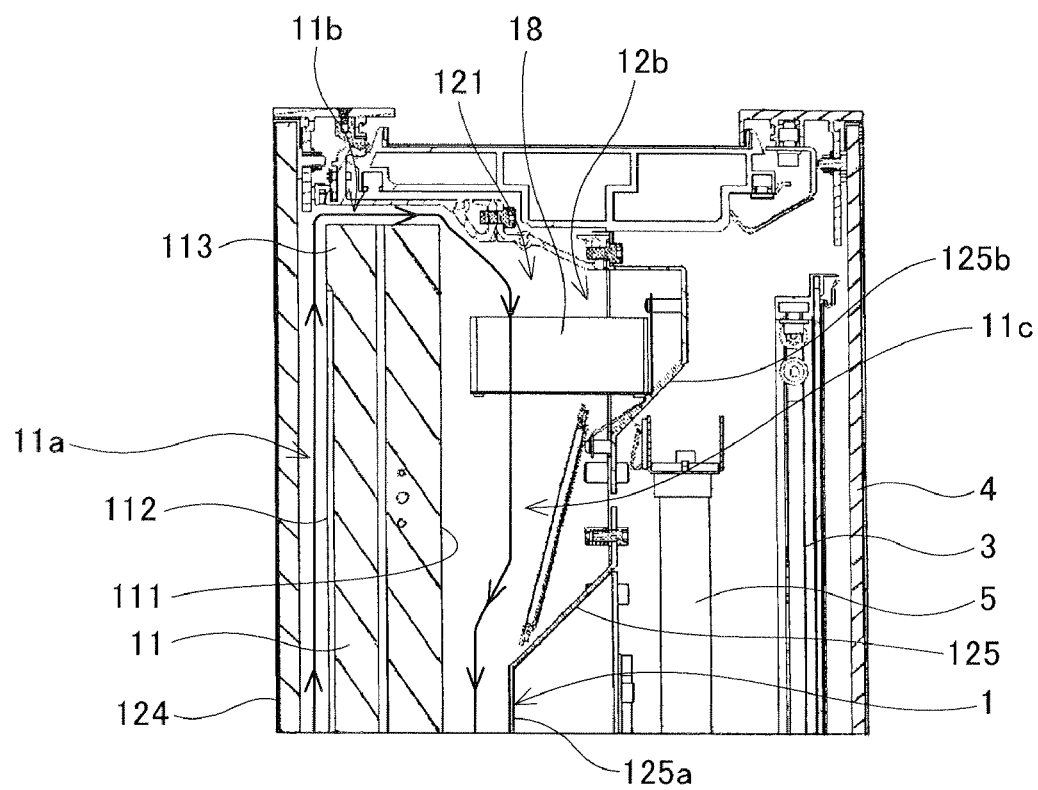
FIG. 13 is an enlarged view of a XIII area shown in FIG. 12.

The circulation fans 18 make the air in the flow path portion 11c of the circulation flow path 92 flow downward as shown in FIG. 13.

The circulation fans 181 are arranged in the inside of the accommodation room 121 on the rear surface 111 side of the image display panel 11 and adjacent to the evaporator 191. In this embodiment, as shown in FIGS. 11 and 12, the circulation fans 181 are arranged at positions in the lower end part of the flow path portion 11c of the circulation flow path 92 and above the evaporator 191.

Figure 14:
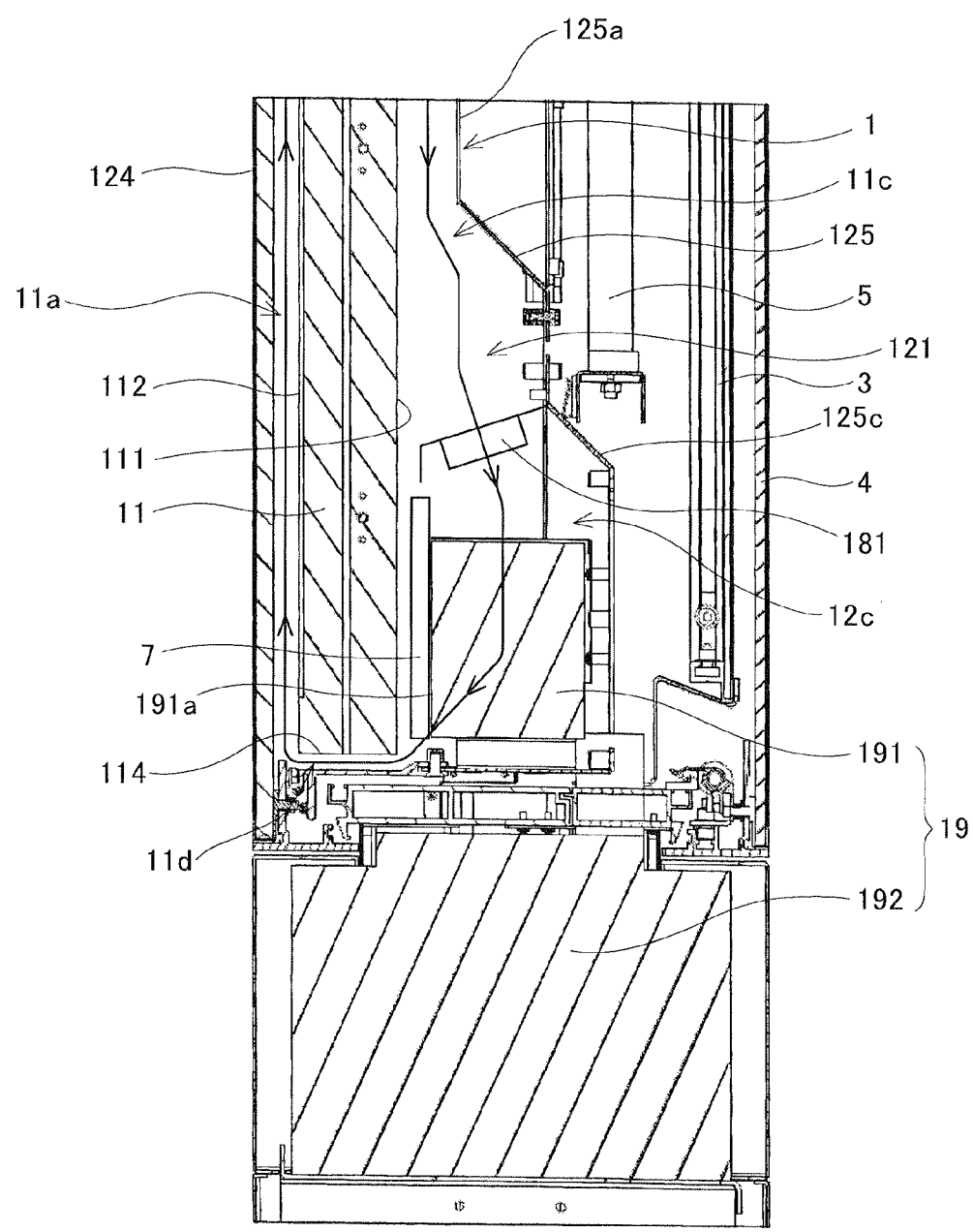
FIG. 14 is an enlarged view of a XIV area shown in FIG. 12.

The circulation fan 181 sends wind toward the evaporator 191 as shown in FIG. 14. The circulation fan 181 has a function to draw the air from the upper part of the circulation flow path 92.

As shown in FIGS. 13 and 14, the air in the circulation flow path 92 thereby circulates around the image display panel 11 in a direction of the solid line arrows.

In other words, by driving the circulation fans 18, 181, the air in the flow path portion 11*a* along the display screen 112 of the image display panel 11 flows from bottom to top in the generally vertical direction and passes through the flow path portion 11*b* along the upper end surface 113 of the image display panel 11 to flow into the path portion 11*c* along the rear surface 111 as shown in FIG. 13. The air which flowed into the flow path portion 11*c* flows from top to bottom along the flow path portion 11*c* and passes through the flow path portion 11*d* along the lower end surface 114 of the image display panel 11 to return to the flow path portion 11*a* as shown in FIG. 14.

By using the circulation fans 18, 181 described above, the air in the flow path portion 11*a* along the display screen 112 of the image display panel 11 can be led to the flow path portion 11*c* along the rear surface 111 efficiently. Therefore, the heat generated in a part adjacent to the display screen 112 of the image display panel 11 is collected by the heat pipes 13 arranged in the rear surface 111 side of the image display panel 11 and the evaporator 191 efficiently. In other words, by using the air in the circulation flow path 92, it is possible to air-cool the image display panel 11, in particular, the display screen 112 of the image display panel 11.

Therefore, temperature increase of the image display panel 11 is restrained, and as a result, the function of the image display panel 11 is maintained in a preferable state.

When it is taken into account that the image display panel 11 is air-cooled by the circulation fans 18, 181, the heat pipes 13 and the evaporator 191, it can be understood that a cooling mechanism is formed by the circulation fans 18, 181, the heat pipe 13*s* and the evaporator 191.

In this embodiment, since wind is sent toward the evaporator 191 by the circulation fan 181 (cf. FIG. 14), the air in the circulation flow path 92 can be sent into the evaporator 191 without stagnation in the flow path portion 11*c*. Therefore, the heat can be collected by the evaporator 191 efficiently.

Also, in this embodiment, since the circulation fans 18, 181 are arranged in the upper end part and the lower end of the flow path portion 11*c* respectively, the air is easy to flow along the circulation flow path 92, and the flow speed increases. Therefore, the image display panel 11 can be cooled uniformly, and as a result, it does not happen that only a part of the image display panel 11 adjacent to the evaporator 191 is cooled.

Figure 15:
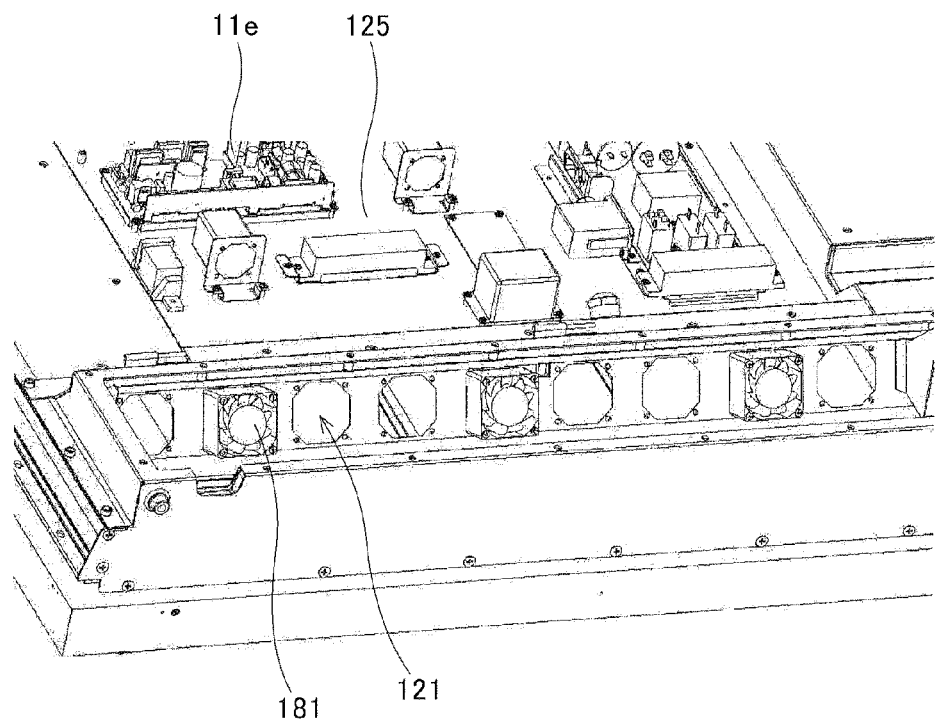
FIG. 15 is a perspective view of a rear surface wall forming an accommodation room seen from below on a rear surface side.
Figure 16:
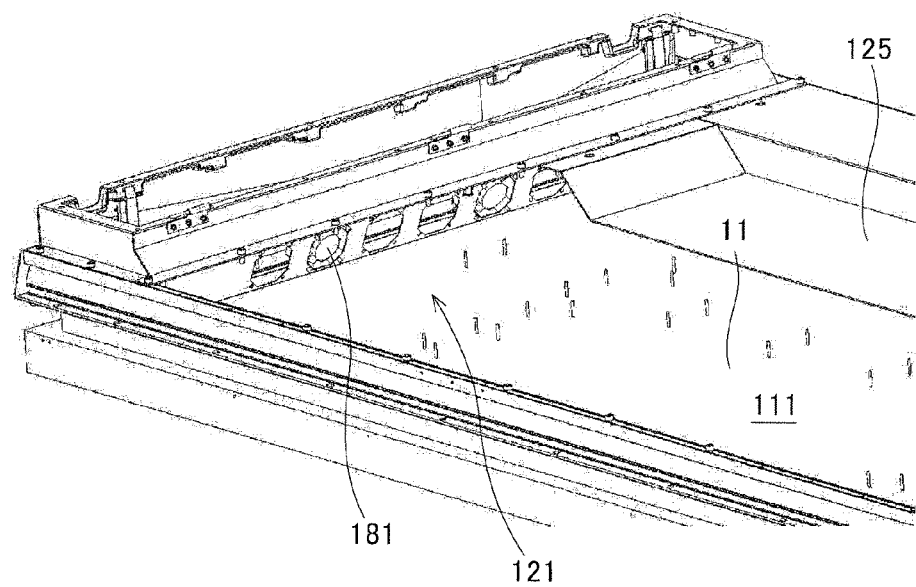
FIG. 16 is a perspective view of the rear surface wall seen from above on a rear surface side.

However, if the speed of the air flowing through the circulation flow path 92 increases excessively, the heat exchange efficiency in the evaporator 191 decreases. Therefore, in this embodiment, it is preferable that ten circulation fans 18 are arranged in the upper end part of the flow path portion 11*c* as shown in FIG. 4, while three circulation fans 181 are arranged in the lower end part of the flow path portion 11*c* as shown in FIGS. 15 and 16.

Further, in this embodiment, the air in the flow path portion 11*a* along the display screen 112 of the image display panel 11 flows from bottom to top in the generally vertical direction. Therefore, also due to a property of the air of rising when warmed by heat, the air in the flow path portion 11*a* flows from bottom to top efficiently.

Therefore, the air is easy to circulate along the circulation flow path 92, and the heat generated in a part adjacent to the display screen 112 of the image display panel can be led to the heat pipes 13 and the evaporator 191 efficiently. As a result, the heat exchange (heat collection) efficiency in the heat pipes 13 and the evaporator 191 increases, thereby increasing the cooling efficiency of the image display device 1.

Further, in this embodiment, the air in the circulation flow path 92 can be circulated efficiently since the circulation fans 18 are arranged in the upper end part of the flow path portion 11*c* of the circulation flow path 92, namely at a position adjacent to the flow path portion 11*b* along the upper end surface 113 of the image display panel 11. The reason is described below.

In a part of the circulation flow path 92 where the circulation flow path 92 is widened, a path resistance decreases. In particular, the circulation flow path 92 is narrow in the flow path portion 11*b* and is widened at the entrance to the flow path portion 11*c* from the flow path portion 11*b* as shown in FIG. 13. Thus, the air in the flow path portion 11*b* is easy to be led to the flow path portion 11*c*.

Therefore, by arranging the circulation fans 18 in the upper end part of the flow path portion 11*c*, the air in the flow path portion 11*b* can be led to the flow path portion 11*c* efficiently. As a result, the air in the circulation flow path 92 circulates efficiently.

In the case where the circulation flow path 92 is widened at the entrance to the flow path portion 11*b* from the flow path portion 11*a*, the circulation fans 18 may be arranged at or in the vicinity of a position where the air flows out from the flow path portion 11*a* for the same reason as above.

As mentioned earlier, since the circulation fans 18, 181 are arranged in the rear surface 111 side of the image display panel 11, it is possible to avoid an increase in size of the image display device 1 in the height direction.

In this embodiment, the circulation fans 18, 181 are used as the circulating means for circulating the air in the circulation flow path 92, but another circulating means may be employed instead of the circulation fans 18, 181.

2-6. Heat Releasing Fin

The heat releasing fin 14 is arranged in the inside of the ventilation path 122 as shown in FIG. 9, and is connected to a projecting part 131 of the heat pipe 13 projecting to the inside of the ventilation path 122. In this embodiment, the heat releasing fin 14 is formed of aluminum.

In particular, each of the heat releasing fins 14 comprises a first heat releasing part 141 and a second heat releasing part 142 sandwiching the projecting part 131 of the heat pipe 13 from both sides. The first heat releasing part 141 includes a base part 141*a* and a fin part 141*b* coupled with the base part 141*a* perpendicularly, and is arranged on a front surface of the housing 12 side of the projecting part 131 of the heat pipe 13.

The second heat releasing part 142 includes a base part 142*a* and a fin part 142*b* coupled with the base part 142*a* perpendicularly, and is arranged on a rear surface side of the housing 12 side of the projecting part 131 of the heat pipe 13.

Figure 17:
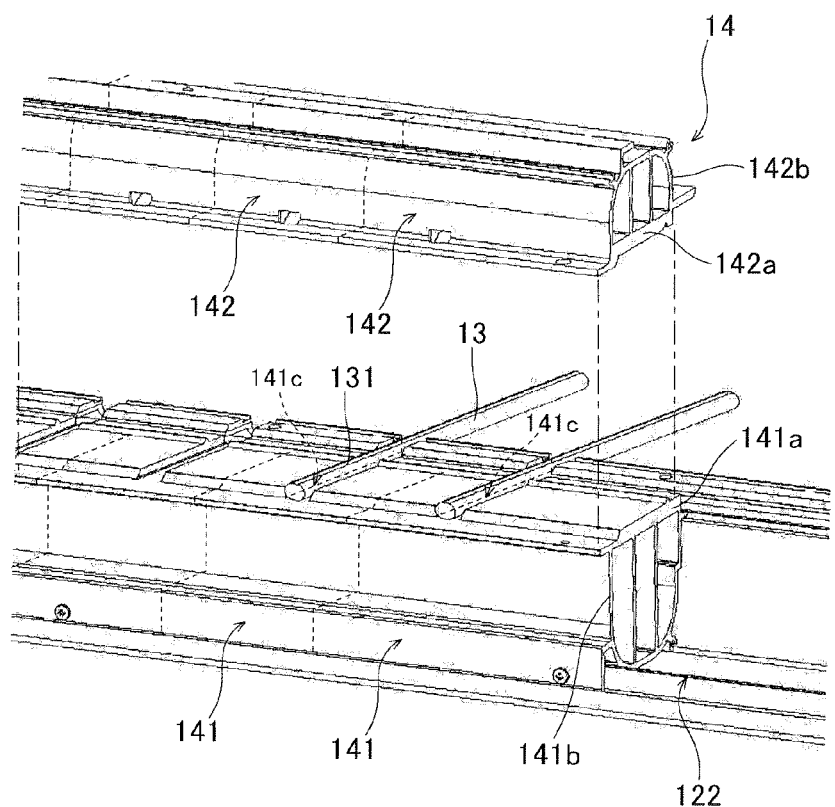
FIG. 17 is an exploded perspective view of a heat releasing fin.
Figure 18:
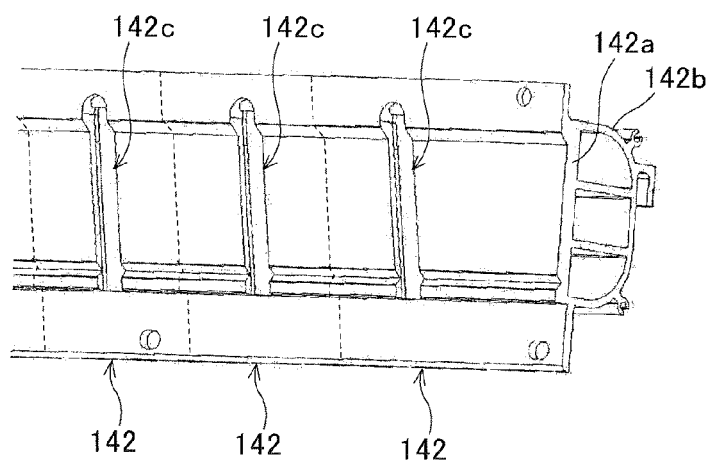
FIG. 18 is a perspective view of a second heat releasing part forming the heat releasing fin.

In the base parts 141*a* and 142*a* of the first heat releasing part 141 and the second heat releasing part 142, defined is a pair of grooves 141*c*, 142*c* as shown in FIGS. 17 and 18. The projecting part 131 of the heat pipe 13 fits in the pair of grooves 141*c*, 142*c* when the projecting part 131 is sandwiched by the first heat releasing part 141 and the second heat releasing part 142 from both sides.

More specifically, the pair of grooves 141*c*, 142*c* is formed in the shape of a semicylinder, and when the projecting part 131 of the heat pipe 13 is sandwiched from both sides by the first heat releasing part 141 and the second heat releasing part 142, a cylindrical hole is formed by the pair of grooves 141c, 142c, and the projecting part 131 of the heat pipe 13 fits in the cylindrical hole.

In this embodiment, the plurality of heat pipes 13 are arranged on the rear surface 111 of the image display panel 11 in line in the generally vertical direction (cf. FIG. 4), and the plurality of heat releasing fins 14 corresponding to the plurality of heat pipes 13 are arranged inside the ventilation path 122 in the generally vertical direction.

As shown in FIGS. 17 and 18, a plurality of first heat releasing parts 141 corresponding to the plurality of heat pipes 13 are formed integrally, and a plurality of second heat releasing parts 142 corresponding to the plurality of heat pipes 13 are also formed integrally.

In a similar manner to the heat releasing fins 14 arranged inside the ventilation path 122 described above, the heat releasing fins 14 are arranged in the inside the ventilation path 123 also (cf. for example, FIG. 4).

By using the heat releasing fins 14 described above, the heat dissipation efficiencies from the heat pipes 13 to the inside of the ventilation paths 122, 123 increase, resulting in the increase in the cooling efficiency of the image display device 1.

In this embodiment, each of the heat releasing fins 14 comprises the first heat releasing part 141 and the second heat releasing part 142, and the pair of grooves 141c, 142c is formed in the first heat releasing part 141 and second heat releasing part 142. And therefore, by simply sandwiching the heat pipe 13 from both sides by the first heat releasing part 141 and the second heat releasing part 142 to make the heat pipe 13 fitted in the pair of grooves 141c, 142c, it is possible to connect the heat releasing fins 14 to the heat pipe 13 while forming the heat releasing fins 14. Therefore, it is easy to connect the heat releasing fins 14 to the heat pipe 13.

In this embodiment, the plurality of first heat releasing parts 141 corresponding to the plurality of heat pipes 13 are formed integrally, and the plurality of second heat releasing parts 142 corresponding to the plurality of the heat pipes 13 are also formed integrally. Therefore, it is possible to attach the heat releasing fin 14 to all the plurality of heat pipes 13 each by performing one operation of sandwiching the plurality of heat pipes 13 with the first heat releasing parts 141 and the second heat releasing parts 142. As a result, installation of the heat releasing fins 14 to the plurality of heat pipes 13 is simplified.

In this embodiment, in each first heat releasing part 141, a plurality of fin parts 141b are coupled with the base part 141a perpendicularly as shown in FIG. 17, and a gap is defined between the fin parts 141b. This is similar in each second heat releasing part 142. The air flowing through the ventilation paths 122, 123 flows through the gap described above.

In FIG. 17, tips of the plurality of fin parts 141b are coupled with each other by a coupling part in each first heat releasing part 141, and the gap mentioned above is surrounded by the fin part 141b, the base part 141a and the coupling part. This is similar in each second heat releasing part 142. In such a case, it is possible to use the heat releasing fins 14 as duct fins which function also as ducts by making the air in the ventilation paths 122, 123 pass through only the said gap. Of course the air in the ventilation paths 122, 123 may pass both through the gap and outside the gap.

In this embodiment, the heat releasing fin 14 is used as a heat releasing member for increasing the heat dissipation efficiency from the heat pipe 13 to the inside of the ventilation paths 122, 123, however, another heat releasing member may be employed instead of the heat releasing fin 14.

2-7. Ventilation Fan

The ventilation fans 15, 16 are arranged in the inside of the ventilation path 122 as shown in FIG. 4, and the ventilation fan 15 is arranged in the upper end part 122a of the ventilation path 122, while the ventilation fan 16 is arranged in the lower end part 122b of the ventilation path 122.

The ventilation fans 15, 16 make the air in the ventilation path 122 flow along the ventilation path 122 in the same direction. In particular, the ventilation fan 15 exhausts the air in the ventilation path 122 via the ventilation hole 62 to the outside of the housing 12 as shown in FIG. 6, thereby making the air in the ventilation path 122 flow from bottom to top in the generally vertical direction. The ventilation fan 16 inhales the air outside the housing 12 via the ventilation hole 61 to the inside of the ventilation path 122 as shown in FIG. 7, thereby making the air in the ventilation path 122 flow from bottom to top in the generally vertical direction. In FIGS. 6 and 7, a flow of the air is indicated by solid line arrows.

In the inside of the ventilation path 123 also, the ventilation fans 15, 16 are arranged in a similar manner to the ventilation path 122 (cf. FIG. 4), and the ventilation fans 15, 16 make the air in the ventilation path 123 flow from bottom to top in the generally vertical direction.

By using the ventilation fans 15, 16 described above, the heat released to the inside of the ventilation paths 122, 123 from the heat pipes 13 can be dissipated to the outside of the housing 12 efficiently. Therefore, in the ventilation paths 122, 123, the heat dissipation efficiencies of the heat pipes 13 and the heat releasing fins 14 increase.

In this embodiment, the air in the ventilation paths 122, 123 flows from bottom to top, and therefore, also due to a property of the air of rising when warmed, the air in the ventilation paths 122, 123 warmed by the heat released to the inside of the ventilation paths 122, 123 flows from bottom to top efficiently. Therefore, the heat released within the ventilation paths 122, 123 can be dissipated to the outside of the housing 12 efficiently.

In this embodiment, the ventilation fans 15, 16 are used as fan means to exhaust the air in the ventilation paths 122, 123 to the outside of the housing 12, however, another fan means may be employed instead of the ventilation fans 15, 16.

2-8. Heat Collecting Fin

Each of the heat collecting fins 17 is connected to the plurality of heat pipes 13 in the inside of the accommodation room 121 as shown in FIG. 4. In particular, each of the heat collecting fins 17 comprises a base part 171 and a fin part 172 as shown in FIG. 9. The base part 171 extends over the plurality of heat pipes 13, and comes into contact with the plurality of heat pipes 13. The fin part 172 is coupled perpendicularly to the surface of the base part 171, and extends from one end of the base part 171 to the other end of the base part 171 in the longitudinal direction.

By using the heat collecting fins 17 described above, it is possible to efficiently collect the heat released from the image display panel 11 to the inside of the circulation flow path 92 and lead it to the heat pipes 13. A function of each heat pipe 13 as the heat exchanger is thereby enhanced, resulting in the increase in the cooling efficiency of the image display device 1.

In FIG. 4, the heat collecting fins 17 are connected only to the heat pipes 13 on the ventilation path 122 side of the centerline 111a. However, in reality, the heat collecting fins 17 are connected also to the heat pipes 13 on the ventilation path 123 side similarly.

In this embodiment, the heat collecting fin 17 is used as the heat collecting member for collecting heat from the air flowing through the circulation flow path 92, however, another heat collecting member may be employed instead of the heat collecting fin 17.

2-9. Heat Insulation Member

The heat insulation member 7 is interposed between the evaporator 191 and the image display panel 11 as shown in FIG. 14. In particular, the evaporator 191 is arranged in the rear surface 111 side of the image display panel 11, and the heat insulation member 7 is arranged between the rear surface 111 of the image display panel 11 and a front surface 191a of the evaporator 191. Urethane or silicon-based rubber is used, for example, for a material of the heat insulation member 7.

As mentioned earlier, the heat generated in the image display panel 11 is led to the evaporator 191 through the medium of the air flowing in the circulation flow path 92 and is collected by the evaporator 191. By using the heat insulation member 7 described above, it is possible to prevent a part of the image display panel 11 adjacent to the evaporator 191 from being cooled excessively in a process of collecting heat by the evaporator 191. Therefore, a temperature distribution of the image display panel 11 becomes uniform, resulting in maintaining the function of the image display panel 11 in a preferable state.

3. Arrangement of Lighting Apparatus

The rear surface wall 125 forming the accommodation room 121 includes a vertical wall part 125a and inclined wall parts 125b, 125c as shown in FIG. 12. The vertical wall part 125a extends along the rear surface 111 of the image display panel 11. The inclined wall part 125b bends toward the backboard 3 from the upper end of the vertical wall part 125a and extends in the obliquely upward direction, while the inclined wall part 125c bends toward the backboard 3 from the lower end of the vertical wall part 125a and extends in the obliquely downward direction.

First accommodation spaces 12b, 12c along the front surfaces of the inclined wall parts 125b, 125c respectively are thereby defined between the rear surface wall 125 and the rear surface 111 of the image display panel 11. In other words, the first accommodation spaces 12b, 12c are defined in the upper end part and the lower end part of the flow path portion 11c of the circulation flow path 92 respectively.

Also, a second accommodation space 12a along the rear surface of the vertical wall part 125a is defined between the rear surface wall 125 and the backboard 3.

The circulation fan 18 is arranged in one of the first accommodation spaces 12b as shown in FIGS. 12 and 13, while the circulation fan 181 and the evaporator 191 are arranged in the other first accommodation space 12c as shown in FIGS. 12 and 14.

Also, the lighting apparatus 5 for illuminating the advertising film is arranged in the second accommodation space 12a as shown in FIG. 12. In particular, a plurality of fluorescent lamps forming the lighting apparatus 5 are arranged in line horizontally along the vertical wall part 125a in the inside of the second accommodation space 12a.

By providing the inclined wall parts 125b, 125c on the rear surface wall 125 forming the accommodation room 121 as mentioned earlier, the first accommodation spaces 12b, 12c where the circulation fans 18, 181 and the evaporator 191 are arranged are defined inside the accommodation room 121, and the second accommodation space 12a where the lighting apparatus 5 are arranged is defined outside of the accommodation room 121 at a position generally below the circulation fans 18, and generally above the circulation fans 181 and the evaporator 191. In other words, the second accommodation space 12a is interposed between the first accommodation spaces 12b, 12c in the vertical direction or in the generally vertical direction.

Therefore, it is possible to arrange the circulation fans 18, 181, the evaporator 191 and the lighting apparatus 5 in the vertical direction or generally vertical direction, and as a result, it is possible to avoid the increase in size of the image display device 1 in the thickness direction.

4. Modification 4-1. Modification 1

In the image display device 1 described above, the plurality of heat pipes 13 are arranged in repetition at the predetermined interval in the generally vertical direction (cf. FIG. 4), however, this is not the limitation and there may be another embodiment. For example, the heat pipes 13 may be arranged at different interval.

However, it is preferable that the heat pipes 13 are arranged through the whole rear surface 111 of the image display panel 11 in a similar manner to the image display device 1 described above from a point of view of increasing the cooling efficiency of the image display device 1. The heat can be thereby collected from the whole rear surface 111 of the image display panel 11.

4-2. Modification 2

In the image display device 1 described above, the ventilation fans 15, 16 make the air in the ventilation paths 122, 123 flow from bottom to top, however, they may make the air flow from top to bottom. For example, in consideration of environment or the like of the installation location of the image display system provided with the image display device 1, the air in the ventilation paths 122, 123 better flows from top to bottom in some cases.

Also, in the image display device 1 described above, two ventilation fans are provided to each of the ventilation paths 122, 123, however, the number of ventilation fans to be provided to the ventilation paths 122, 123 may be one or may be three or more.

Further, in the image display device 1 described above, the ventilation fans 15 are arranged in the upper end parts 122a, 123a of the ventilation paths 122, 123, and the ventilation fans 16 are arranged in the lower end parts 122b 123b of the ventilation paths 122, 123, however, they may be arranged in other positions, not limited to these positions. However, it is necessary to arrange them so that the air in the ventilation paths 122, 123 can be exhausted to the outside of the housing 12.

4-3. Modification 3

In the image display device 1 described above, the circulation flow path 92 comprises the flow path portion 11a along the display screen 112, the flow path portion 11b along the upper end surface 113, the flow path portion 11c along the rear surface 111, and the flow path portion 11d along the lower end face 114. However, another course surrounding the image display panel 11 in the inside of the accommodation room 121 may be used as the circulation flow path 92.

For example, flow path portions may be defined between the side surface of the image display panel 11 and the side surface walls 121a, 121b forming the accommodation room 121 respectively, to define the circulation flow path 92 by said flow path portions and the flow path portions 11a, 11c.

Also, the image display device 1 described above, the circulation fans 18 make the air in the flow path portion 11a along the display screen 112 flow from bottom to top, however, the circulation fans 18 may make the air flow from top to bottom. In such a case, it is preferable to install the circulation fan 18 in the position adjacent to the lower end surface 114 of the image display panel 11. The position of the circulation fans 18 is not limited to the position adjacent to the upper end surface 113 or the lower end surface 114 of the image display panel 11, and may be another position.

4-4. Modification 4

In the image display device 1 described above, the circulation fans 181 are arranged in the position above the evaporator 191 in the lower end part of the flow path portion 11c of the circulation flow path 92, however, the circulation fans 181 may be arranged in the position below the evaporator 191.

Since the circulation fans 181 take in the air from the evaporator 191 according to such an embodiment, the air is sent into the evaporator 191 from above. Therefore, the heat can be collected by the evaporator 191 efficiently.

4-5. Modification 5

In the image display device 1 described above, the heat releasing fins 14 arranged inside the ventilation path 122 is formed by the first heat releasing part 141 and the second heat releasing part 142, and the projecting part 131 of the heat pipe 13 is sandwiched from both sides by the first heat releasing part 141 and the second heat releasing part 142 with the projecting part 131 fitted in the pair of grooves 141c, 142c. However, it is also possible that, for example, each heat releasing fin 14 is formed only by the first heat releasing part 141, and the heat releasing fin 14 is attached to the projecting part 131 of the heat pipe 13 by fitting the projecting part 131 of the heat pipe 13 in the groove 141c defined in the first heat releasing part 141.

According to such an embodiment, installation of the heat releasing fins 14 to the heat pipe 13 can be simplified.

The present invention is not limited to the foregoing embodiment in construction but can be modified variously within the technical scope set forth in the appended claims. For example, as well as the liquid crystal display, the technique can be applied in an image display device which includes the flat-panel display such as a plasma display or an organic electroluminescence (Electro-Luminescence) display.

Also, in the above described embodiment, the circulation fans 18 are provided in order to circulate the air around the image display panel 11, however, the present invention is not limited to this. For example, the fans 18 may be provided in order to form a flow of the air only on the display screen 112 of the image display panel 11. In such a case, the air drawn into the fans 18 is exhausted to the outside, for example, from the upper part of the image display device 1.

What is claimed is:

1. A display device comprising:
    a housing having a waterproof structure and provided with an accommodation room formed therein;
    a ventilation part defined outside the accommodation room and leading to outside of the housing;
    a display panel arranged inside the accommodation room and including a display screen viewable from a front surface side of the housing; and
    one or a plurality of heat pipes arranged on a rear surface side of the display panel,
    the heat pipe passing through a side surface wall forming the accommodation room and extending from inside of the accommodation room to inside of the ventilation part,
    wherein a heat releasing member is connected to the heat pipe in the ventilation part.

2. The display device according to claim 1, wherein the heat releasing member comprises a first heat releasing part and a second heat releasing part which sandwich the heat pipe from both sides, a pair of grooves is defined in the first heat releasing part and the second heat releasing part, and the heat pipe fits in the pair of grooves.

3. The display device according to claim 2, wherein the plurality of heat pipes are arranged in line in the vertical direction on the rear surface side of the display panel, the heat releasing member which comprises the first heat releasing part and the second heat releasing part is connected to each of the plurality of heat pipes, the first heat releasing parts are arranged on the front surface of the housing side of the heat pipes and formed integrally, and the second heat releasing parts are arranged on the rear surface of the housing side of the heat pipes and formed integrally.

4. The display device according to claim 1, wherein a groove in which the heat pipe is to fit in the ventilation part is defined in the heat releasing member.

5. A display device comprising:
    a housing having a waterproof structure and provided with an accommodation room formed therein;
    a ventilation part defined outside the accommodation room and leading to outside of the housing;
    a display panel arranged inside the accommodation room and including a display screen viewable from a front surface side of the housing; and
    one or a plurality of heat pipes arranged on a rear surface side of the display panel,
    the heat pipe passing through a side surface wall forming the accommodation room and extending from inside of the accommodation room to inside of the ventilation part,
    wherein the heat pipe is fixed to the rear surface of the display panel.

6. A display device comprising: a display panel; a housing sealing around the display panel and making a display screen of the display panel viewable from outside; a ventilation part extending in the vertical direction on a side surface side of the display panel; a heat pipe arranged on a rear surface side of the display panel and extending into the ventilation part; and a fan making air in the ventilation part flow from one end to the other end of the ventilation part.

* * * * *